(12) United States Patent
Whiting

(10) Patent No.: US 6,377,334 B2
(45) Date of Patent: Apr. 23, 2002

(54) METHOD FOR CONTROLLING IMAGE SIZE OF INTEGRATED CIRCUITS ON WAFERS SUPPORTED ON HOT PLATES DURING POST EXPOSURE BAKING OF THE WAFERS

(75) Inventor: Charles A. Whiting, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/768,973

(22) Filed: Jan. 24, 2001

Related U.S. Application Data

(62) Division of application No. 09/314,368, filed on May 19, 1999.

(51) Int. Cl.[7] .................. G03B 27/52; G03B 27/72; G03B 27/54; G03C 5/00; A61N 5/00
(52) U.S. Cl. .................. 355/55; 355/35; 355/67; 355/72; 355/77; 430/30; 250/492.2; 250/492.22
(58) Field of Search .................. 355/35, 55, 67, 355/72, 77; 430/30; 250/492.22, 492.2

(56) References Cited

U.S. PATENT DOCUMENTS 5,550,007 A * 8/1996 Taylor et al. ............... 430/314
5,656,182 A * 8/1997 Marchman et al. ............ 430/4

* cited by examiner

*Primary Examiner*—Russell Adams
*Assistant Examiner*—Khaled Brown
(74) *Attorney, Agent, or Firm*—Scully, Scott, Murphy, Presser; William D. Sabo, Esq.

(57) ABSTRACT

A method for the control of wafer surface temperatures during post exposure bake on hot plates of wafers which carry integrated circuits. Also disclosed is a method of maximizing image size uniformity for integrated circuits through the zonal control of temperatures of hot plates during post exposure bake processes for effectively modulating the wafer surface temperatures. Images within a semiconductor wafer integrated circuit line pattern are repeated to process a wafer through the photolithographic patterning process, including post exposure baking, to measure the image linewidths and compare these with an experimentally derived correlation chart; for instance, PEB temperature vs. linewidth for a given or specified photomasking process. The data is then mapped with regard to image size versus hot plate position, and individual heating zones of the hot plate are adjusted in their temperature for maximum degree of image size uniformity and ultimately attaining optimal device speed and pattern line processing uniformity control.

5 Claims, 2 Drawing Sheets

RESIST CHARACTERIZATION DATA

METHOD FOR CONTROLLING IMAGE SIZE OF INTEGRATED CIRCUITS ON WAFERS SUPPORTED ON HOT PLATES DURING POST EXPOSURE BAKING OF THE WAFERS

This application is a divisional application of Ser. No. 09/314,368; filed on May 19, 1999.

BACKGROUND OF THE INVENTION

1. Field of the Invention

The present invention relates to a method for the control of wafer surface temperatures of wafers which carry integrated circuits. More particularly, the invention is directed to a method of maximizing image size uniformity for integrated circuits through the zonal control of temperatures of hot plates employed in the fabrication of semiconductor devices.

2. Discussion of the Prior Art

Numerous publications in this technology address themselves in varying degrees of applicability to the problem of controlling wafer surface temperatures, for example, during the post exposure baking of integrated circuit-carrying wafers for semiconductor devices.

Maeda, U.S. Pat. No. 5,626,782 is directed to a post exposure baking apparatus for forming fine resist integrated circuit line patterns on semiconductor wafers. In particular, this patent provides a capability for an evaluation in the changes of linewidth, and calculation methods for the temperatures in order to obtain desired linewidths for the integrated circuits, and for this purpose incorporates a plurality of heating pins which are independently temperature-controlled.

Marchman, et al., U.S. Pat. No. 5,656,182 is directed to a process for fabricating a device wherein control is provided by a near-field imaging latent effect which is introduced into energy-sensitive resist material. This effects a control over resist process parameters, wherein one of the parameters relates to the post-exposure baking.

Hobbs, et al., U.S. Pat. No. 5,516,608 is directed to a method for controlling line dimensions formed in a photolithographic process. The method employed in this patent consist of in implementing a measurement of an exposed pattern during the pattern development, and enables a real-time in-line control over critical dimensions for positive-tone chemically implied photoresist systems.

Tani, et al., U.S. Pat. No. 5,252,435 discloses a method for forming a pattern of integrated circuits on a substrate such as a wafer or chip through the intermediary of a high contrast pattern formed by the use of a post-exposure baking step in photoresist processing.

Although all of the foregoing patents to varying degrees direct themselves to different aspects of providing a control over the precision in the size and width of the line pattern for the formed integrated circuits, and also over the control of the semiconductor wafer surface temperatures during the post exposure bake step, there is no disclosure of the unique inventive feedback control concept which may be employed with the use of the in situ surface temperature-adjustable or controllable hot plate, as described in commonly assigned co-pending application Serial No. 09/361,451 (Attorney Docket No. BU998-223; 12235), the disclosure of which is incorporated herein by reference.

SUMMARY OF THE INVENTION

At this time, large hot plates, which are ordinarily obtainable from laboratory supply companies, are frequently incompatible with modern lithographic processing employed in the production of semiconductor devices, and the need for the precise control of all steps during the implementation of such processes. In essence, various processes of this type employed in the technology require; for instance, an extremely fine degree of precision to be applied in the temperature control of the post exposure bake step of the baking wafers which have integrated circuits formed thereon. Moreover, in the semiconductor production technology, wafers have become progressively larger in size, and consequently necessitate the utilization of ever larger hot plates. Such considerably larger hot plates are subject to both spatial and temporal non-uniformities which render them unsuitable to applications for lithographic processing. It is also well-known that temperature uniformity during lithographic processing, and particularly during the post exposure bake process step, such as temperatures ranging across the surface of the wafers located on the hot plates, directly affect image size uniformity in integrated circuits formed in lithographic processes employing chemically amplified resist system during the fabrication of semiconductor devices. Thus, any modulation in post exposure bake temperatures can readily change the resultant device image size to a significant degree; for instance, up to about 10–20 nm per degree C.

Accordingly, the present inventive concept relates to incorporating repeating images within a semiconductor wafer integrated circuit line pattern (kerf or functional), to process a wafer through the photolithographic patterning process, including post exposure baking, to measure the image linewidths and compare these with an experimentally derived correlation chart; for instance, PEB temperature vs. linewidth for a given or specified photomasking process. The data is then mapped with regard to image size versus hot plate position, and individual heating zones of the hot plate are adjusted in their temperature for maximum degree of image size uniformity and ultimately attaining optimal device speed and pattern line processing uniformity control.

Basically, the present invention is directed to a method for attaining optimum integrated circuit image size uniformity control for use during integrated circuit fabrication, which includes providing a hot plate having locally adjustable temperature control means; positioning a semiconductor wafer, having a chemically amplified resist system photolithographic pattern thereon, on the hot plate; thereafter developing the wafer; measuring the image linewidth at a plurality of locations across the surface of the wafer; mapping and correlating the obtained image linewidth measurements with known post exposure baking temperature versus linewidth data; and adjusting the hot plate temperature in order to maximize integrated circuit linewidth uniformity.

With regard to the foregoing, it is also contemplated that the invention provides a method for controlling image size using a temperature zone-controllable hot plate such as described in the above-referenced co-pending U.S. patent application Ser. No. 09/361,451, by referring to a specific graphical plot for a specified semiconductor structure which is being fabricated; ascertain information regarding the temperature dependence of the image size, which is essentially linear over a short temperature range; obtaining across the wafer, in each zone, image size data for previously processed lots of wafers; subtracting the desired image size from the previously processed lots for each zone of image size data so as to form a matrix of image size deviations from nominal across the wafer in each zone, (this accounting for any systematic effects of image size control so that this can be later compensated for by temperature control); thereafter calculating the temperature delta (ΔT) from a nominal value required for each zone by dividing each element in the image size deviation in matrix by a plotted graphical slope which is derived from the temperature dependence graph in order to determine the necessary temperature correction for each zone; and retrieving temperature setpoint versus zone image size data for previously run wafer lots, and subtracting the temperature correction for each zone, so as to result in a matrix of zone setpoints which are transmitted to the hot plate zone temperature controller for current lot or wafer processing.

On the basis view of the foregoing, the hot plate zone temperature controller receives a matrix of setpoints and current zone temperature information, and then adjusts the energy or power applied to each zone in order to achieve the targeted temperature for each zone. This method enables each zone to be imparted a personalization or individualization of the hot plate temperature adjusting process in order to compensate for prior wafer processing non-uniformities; for instance, as regards non-uniform resist thickness, underlying thin film nonuniformity, and the like.

Accordingly, it is an object of the present invention to provide a novel method for controlling wafer surface temperatures during post exposure bake employed in the lithographic processing of semiconductor devices.

Another object of the invention resides in the provision of a novel method for obtaining optimal image size uniformity control employed in the fabrication of integrated circuits on a semiconductor wafer through the intermediary of controlling the post exposure bake temperature of a hot plate supporting the semiconductor wafer.

Yet another object of the present invention resides in the provision of a method of controlling temperatures of individual zones of a hot plate supporting semiconductor wafers employed in the post-exposure baking step in the formation of integrated circuits so as to implement corrective action in order to obtain uniformity and integrated circuit linewidth and thickness during manufacture thereof, through feedback information received on the basis of prior temperature controls applied to precedingly processed wafer lots.

BRIEF DESCRIPTION OF THE ACCOMPANYING DRAWINGS

Reference may now be had to the following detailed description of a preferred embodiment of the invention, taken in conjunction with the accompanying drawings; in which.

DETAILED DESCRIPTION OF PREFERRED EMBODIMENTS

Figure 1:
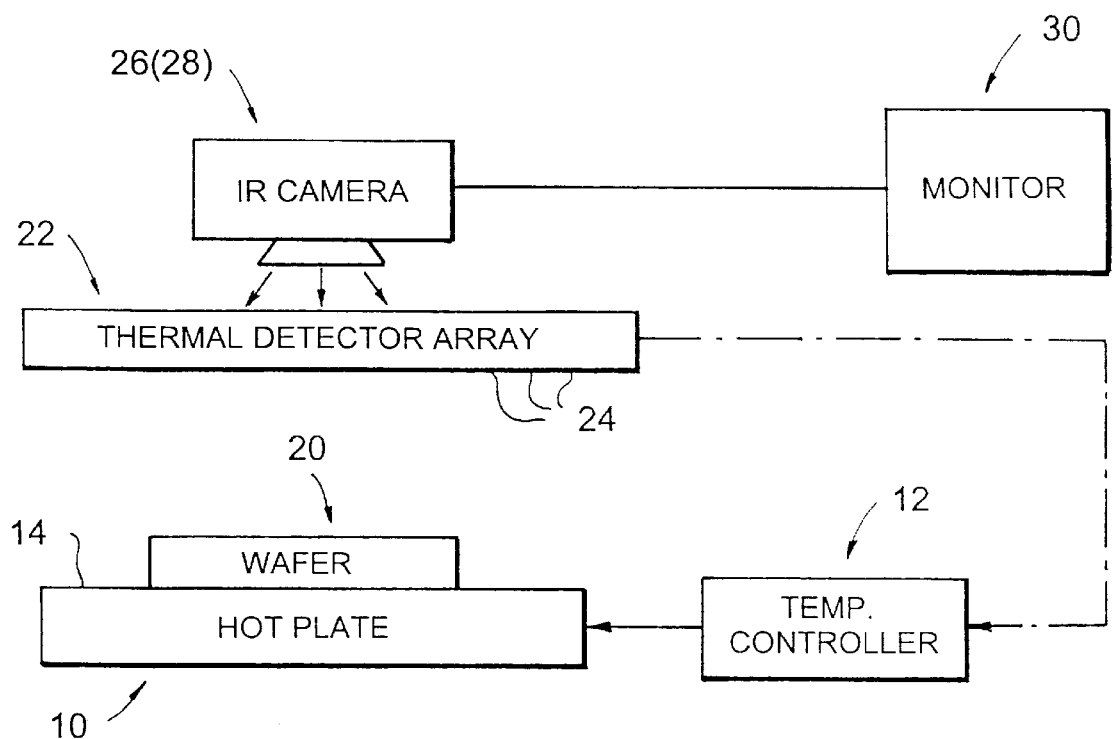
FIG. 1 illustrates, generally diagrammatically, a system and arrangement for the controlling of hot plate surface temperatures and resultingly controlling the temperature of a wafer supported thereon.

Referring in detail to the drawings, and particularly to FIG. 1, there is illustrated a hot plate 10 which is connected to a controller 12 for adjusting the temperature of at least the upper surface 14 of the hot plate 10.

Preferably, the hot plate 10 may be divided into a plurality of zones 16 on surface 14, for example, such as into surface squares; each having heating filaments or elements 18 embedded therein, which in response to the temperature controller 12, may provide for either a uniformly heated hot plate surface 14 or an adjustment of the individual zones 16 of the surface in accordance with specific conditions, as referred to hereinbelow.

Arranged on the hot plate 10 in a predetermined adjusted position is a wafer 20 utilized for the production of semiconductor devices having integrated circuits formed on the upper surface of the wafer, and wherein loading structure (not shown) is adapted to orient the wafer 20 on the surface 14 of the hot plate 10. In essence, the hot plate 10 may be designed so as to support a single standard wafer 20, although it is conceivable that a large-sized hot plate may be employed for simultaneously controlling the temperature of a plurality of predeterminedly spaced wafers thereon.

Positioned at a spaced relationship above the wafer is an array 22 of thermal detectors 24 which are acted upon by either an infrared camera 26 or a pyroelectric or pyrothermal component 28 for detecting the surface temperature of the wafer 10 in correlation with a particular location relative to the thermal detection array located thereabove.

The infrared camera 26 or pyroelectric or pyrothermal component 28 is adapted to map the obtained temperature data from the upper surface 14 of the wafer 20 into the hot plate zones 16 relative to the position of the wafer 20 thereon, and to convey this mapped data to a suitable servo system, as described hereinbelow with regard to FIG. 2, for adjusting and controlling the temperature of the hot plate surface 14 or more particularly the individual hot plate zones 16 through controller 12.

The foregoing data may also be transmitted into an optionally provided monitor 30 which will enable the implementation of spot detection of temperatures, the temperature differentials or deltas Δt) extending across the wafer surface or zones, process control, calibration in uniformity including correlation with previously mapped standard temperature data.

The spot detection is provided for by the temperature detector array 22 as shown in FIG. 1, which is arranged below the infrared camera 26 or the pyroelectric component 28, provides all of the temperature information in correlation with the individual zones 16 on the hot plate 10 on which the wafer 20 is positioned.

Thus, the foregoing enables the monitor 30 and the servo system to provide for in situ visual monitoring of the temperature ranging across the surface of the wafer 20 versus the hot plate surface zones 16 so as to ensure that the hot plate heating system is thermally controlling the wafer 20 to the desired temperature profile which, in turn, will provide for the appropriate linewidths for the integrated circuits being processed in a photolithographic process, during the post exposure baking step, thereby providing a fine or precise degree of control over the resultant device image sizes for the integrated circuit patterns.

Figure 3:
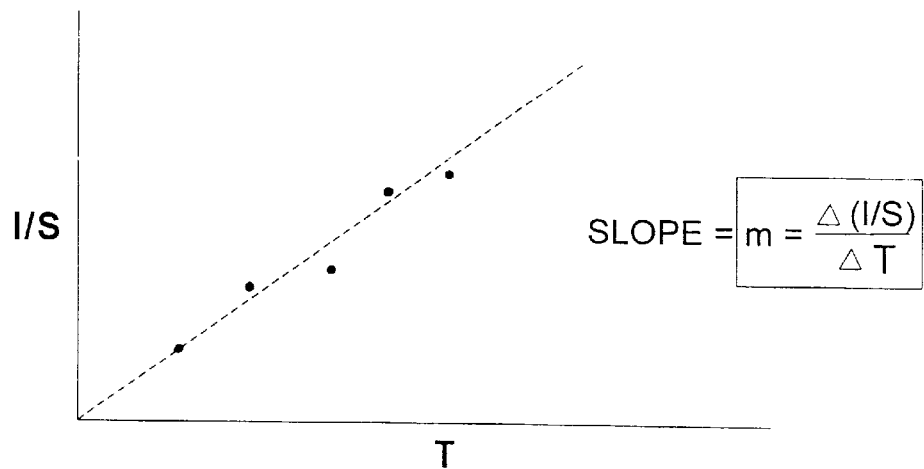
FIG. 3 illustrates a graph showing integrated circuit image size (I/S) changes plotted relative to temperatures sensed at the wafer surface.
Figure 2:
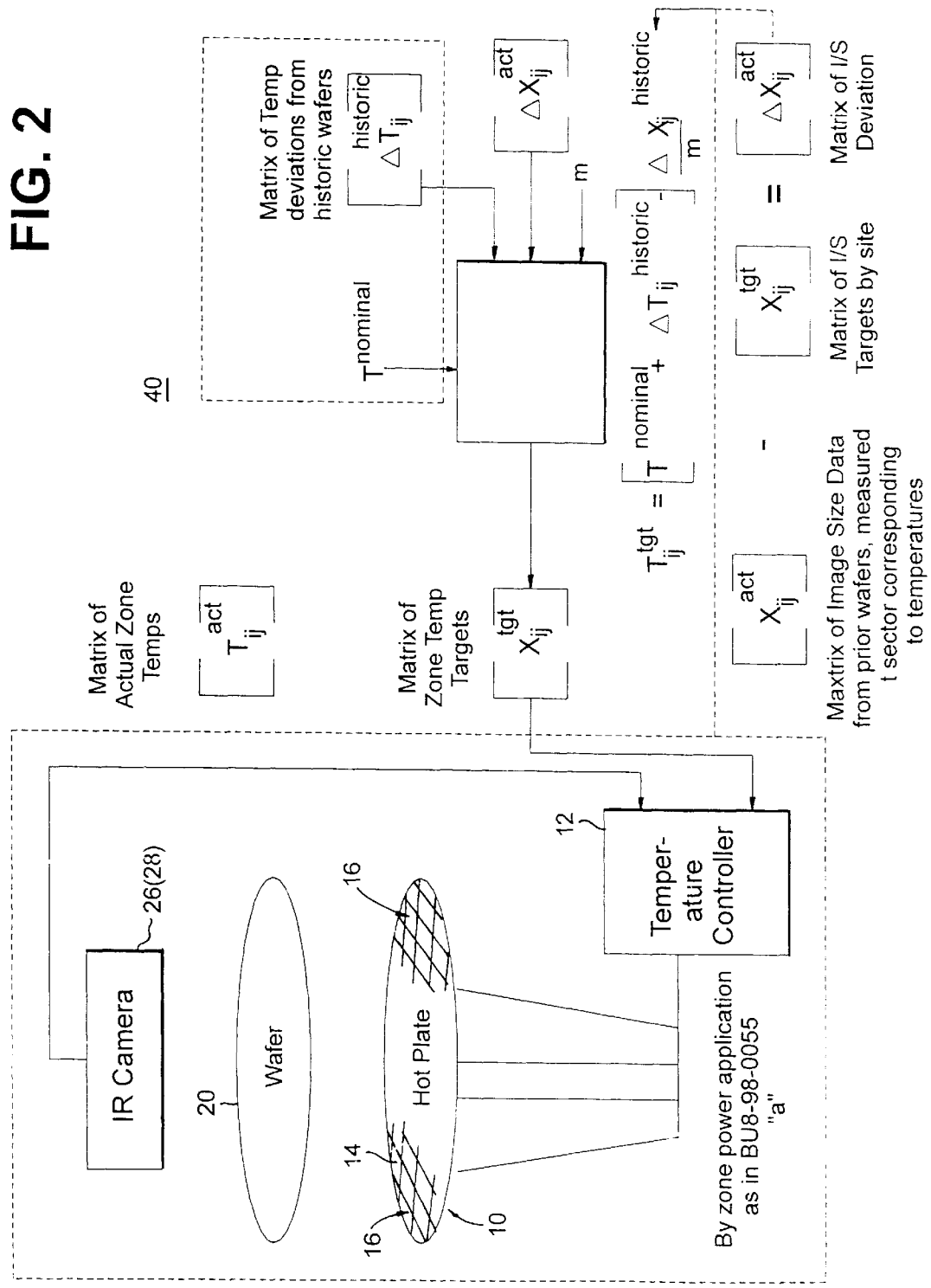
FIG. 2 illustrates, generally diagrammatically, a feedback and temperature differential compensating system for controlling the temperature of the hot plate shown in FIG. 1.

Referring more specifically to FIGS. 2 and 3 of the drawings, there is illustrated a system 40 for providing the feedback to the controller 12 for regulating the temperature of either surface 14 or zones 16 of the hot plate 10, responsive to the scrutinized temperatures of the wafer 20 positioned on the hot plate.

In particular, the system 40 which is operatively connected to respectively the picture output of the infrared camera 26 or the pyroelectric element or pyrometer 28 which senses the temperature of the wafer surface 20, and which is also operatively connected to the controller 12 for applying the power energy to heat the hot plate 10, is drafted to provide a temperature adjustment in correlation with previously obtained for historical data of prior processed wafers, wherein such temperatures employed as a standard.

In essence, the process as described herein with reference to FIG. 2 of the drawings is intended to provide for a plurality of functions; as follows:

(a) Provide a nominal temperature setpoint $T^{nominal}$ which is applicable to all zones 16 of the hot plate 10;

(b) provide a matrix of actual image size measurements, by zone, from prior wafers:

$$X_{ij}^{historic};$$

(c) provide a matrix of actual temperature adjustments used on the wafers 20 measured in order to produce the previous image size measurements:

$$\Delta T_{ij}^{historic};$$

(d) provide a matric of image size targets used on the historic wafers, by zone:

$$X_{ij}^{tgt};$$

(e) calculate a slope of the image size versus temperature response of the resist image, where $$m = \frac{\Delta(I/S)}{\Delta T},$$

wherein m is the linear slope calculated by dividing the change in image size (A (I/S)) by the change in temperature (ΔT);

(f) calculate a matrix of image size deviations from target:

$$\Delta X_{ij}^{historic} = \left(X_{ij}^{historic} - X_{ij}^{tgt}\right)$$

(g) compute a matrix of targeted temperature per zone:

$$T_{ij}^{tgt} = T^{nominal} + \Delta T_{ij}^{historic} - \left(\Delta X_{ij}^{historic}/m\right)$$

(h) and transmit the target zone temperature $$T_{ij}^{tgt}$$

and actual, measured zone temperature $$T_{ij}^{act}$$

to the controller 12 to drive each temperature to the target.

The foregoing information is then transmitted, as indicated in FIG. 2 of the drawings to the controller 12, so as to provide appropriate temperature compensation or adjustment of the hot plate surface or zones in conformance with the previously obtained data for controlling the temperatures of the wafers.

The foregoing system enables the constant autonomous control over the hot plate temperature or the various zones thereof so as to provide for uniformity of surface temperature or precise gradient temperature for each respective zone, thereby enabling the surfaces temperatures of the wafers to be controlled, particularly during post exposure baking, and thereby to provide a required uniformity of integrated circuit linewidth and thickness thereof on the wafers.

While there has been shown and described what are considered to be preferred embodiments of the invention, it will, of course, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

What is claimed is:

1. A system for controlling the image size of integrated circuits on a semiconductor wafer supported on a temperature-controllable hot plate; said system comprising:

(a) means for positioning said wafer on a surface of said hot plate;

(b) means for developing a predetermined temperature pattern across said wafer responsive to controlling the temperature across a plurality of zones extending over the surface of said hot plate; said zones being individually temperature-controllable for controlling the temperature ranging across the surface of said hot plate;

(c) means for measuring the image linewidth of said integrated circuits at a plurality of locations across the surface of said wafer;

(d) means for plotting and correlating the image line measurements with previously plotted image linewidth measurement data relative to past exposure bake temperatures to provide a standard; and (e) means for maximizing image linewidth uniformity by adjusting the temperature across the hot plate surface.

2. A system as claimed in claim 1, wherein a desired image linewidth size is subtracted from previously processed lots for each zonal image linewidth size data to form a matrix of image size deviations from a nominal size across the wafer for each surface zone.

3. A system as claimed in claim 2, wherein a temperature deviation changes (ΔT) are calculated from nominal temperatures required for each surface zone by dividing each element in the image size deviation matrix by a slope plotted from a temperature dependency graph relative to image size so as to determine a temperature correction for each said surface zone.

4. A system as claimed in claim 3, wherein there is retrieved a temperature set point versus zonal image linewidth size data for previously processed wafer lots, and substracting the temperature correction for each said zone so as to result in a matrix of zonal set points which are transmitted to a hot plate temperature controller for zonally adjusting the hot plate surface temperatures for current wafer processing.

5. A system as claimed in claim 1, wherein a temperature controller adjusts the hot plate temperature by modulating a power supply to heating coils arranged in zone across the surface of said hot plate.

* * * * *